(12) United States Patent
Shaeffer et al.

(10) Patent No.: US 6,587,965 B1
(45) Date of Patent: Jul. 1, 2003

(54) SYSTEM AND METHOD FOR SINGLE POINT OBSERVABILITY OF A DUAL-MODE CONTROL INTERFACE

(75) Inventors: Ian P. Shaeffer, San Jose, CA (US); Jeffrey C. Swanson, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/563,004

(22) Filed: Apr. 29, 2000

(51) Int. Cl.[7] ............................................. G06F 11/00
(52) U.S. Cl. ................................... 714/28; 703/28
(58) Field of Search ........................ 714/28, 33, 723, 714/741, 742, 39, 45; 703/28; 717/131

(56) References Cited

U.S. PATENT DOCUMENTS

| | | | | |
|---|---|---|---|---|
| 5,228,039 A | * | 7/1993 | Knoke et al. | 714/28 |
| 5,920,489 A | * | 7/1999 | Dibrino et al. | 716/2 |
| 6,157,904 A | * | 12/2000 | Takasaki | 703/26 |
| 6,233,673 B1 | * | 5/2001 | Higashida | 712/227 |
| 6,332,201 B1 | * | 12/2001 | Chin et al. | 514/234.2 |

OTHER PUBLICATIONS

Oh, Yoon and Chae "Emulator environment based on an Fpga prototyping board" 0–7695–0668–2/00 copyright 2000.*
McDowell and Helmbold "Debugging Concurrent Programs" 0360–0300/89/1200–0593 ACM Computing Surveys, vol. 21, No. 4 Dec. 1989.*
Finley and Pflasterer "realtime Avionics processor Emulators" CH306–8/93/000–129 1993 IEEE.*

* cited by examiner

Primary Examiner—Robert Beausoliel
Assistant Examiner—Bryce P. Bonzo

(57) ABSTRACT

The present invention provides for a method and system for external observation of a dual mode control interface, via a single point of entry/exit from a chip. In operation, data is sent into and retrieved from a chip using a single point on the chip. Multiple test methods can be used with the proper test method selected by an established hierarchy of methods. In one embodiment, an impedance is shown for control purposes between test methods.

19 Claims, 5 Drawing Sheets

$$Z_6 < \frac{R_1}{5}, \quad Z_6 < \frac{R_2}{5}$$

$$R_1 < \frac{R_3}{5}$$

$$R_2 < \frac{R_3}{5}$$

TYPICALLY, $$R_1 = R_2$$

$$Z_4 >> Z_5 \quad (\text{AT LEAST } 10x)$$

SYSTEM AND METHOD FOR SINGLE POINT OBSERVABILITY OF A DUAL-MODE CONTROL INTERFACE

TECHNICAL FIELD

The invention relates in general to diagnostics for computer equipment and in particular to diagnostics for computer chips.

BACKGROUND

Debug ports are pins situated on chips as dedicated pins for driving data from a subject chip at the clock of a system processor. These ports are not used by the system within the chip, but are used by engineers for debugging or for obtaining information about the internal workings of a chip. Most commonly, engineers use these debug ports in preparation of diagnostic tests which are used to address flaws, referred to as issues, which occur in, e.g., general purpose integrated circuits ("ICs"), specialized ICs (i.e., Application Specific Integrated Circuits "ASICs"), and processors (i.e., Central Processor Units "CPUs"). Design errors tend to be the most common type of issue, and they may exist on the chip itself or in the software that is being used within the computer system in which the chip is utilized.

There are generally three types of hardware issues: functional design defects, electrical design defects, and manufacture design defects. These ports are also useful in addressing other issues, such as those based on manufacturing shorts, gaps that occur in the chip where an electrical connection is not made properly, or for addressing errors involving unwanted electrical connections made between two points. Chips are increasingly complicated in design, and accordingly, there are an increasing number of potential flaws in chip technology, thereby necessitating a corresponding rise in the complexity and the use of debug ports. As such, the actual control and manipulation of debug ports has become even more problematic, as each given situation requires different information to be driven out by the pins at different times, in accordance with specific user needs.

Prior art solutions present the user with a choice of methods for controlling the data which is sent to the debug port. One particular prior art solution for this control offers only single mode or unilateral control, (i.e., accessing either the internal control or external control but not both), where the user has one option or method for controlling the interface and the debug port. Different ways for implementing this control are available including monitoring via external control lines (such as user set Dual Inline Package "DIP" switches) or by driving information onto the chip through jumper blocks or pull-up resistors. These control lines use an external interface to tell the chip what data to drive to the debug port, whether these data are from a particular portion of the chip, or from a selected register.

Another prior art option involves control via logic inside the chip itself, and/or setting configuration information through software control of internal registers. The internal control of the prior art employs software to set register values, thereby controlling what data is sent out to the port from the inside. In this method, there are no specific In/Out ("I/O") pins dedicated to controlling the debug port but instead, a specific software application is written to modify data in control registers on the chip, either directly or through a scan interface such as Joint Test Action Group "JTAG".

In any case, prior art solutions involve only one of external or internal solutions. Each of the described prior art methodologies has its own advantages and disadvantages, and, depending on the requisite application, having access to only one type of control has proved insufficient for the user. While some prior art solutions have actually attempted to provide both internal and external control, it has been assumed that it was difficult for the user to know for certain, at any given time, which method had been used by the chip in reporting the data. Thus, any attempts at control of the functionality in the chip were necessarily limited to the fact that no information relating to control is actually provided by the chip at any time. Hence, there is a risk danger that when using the aforementioned approach, that a user may log erroneous data due to a misunderstanding as to what exactly had been done to control that functionality. Furthermore, depending on how the chip itself is designed, it might be possible, for example, for one to set the external control lines to a certain value without realizing that it was being overridden by a piece of software that was being run, thereby further increasing the chance of flawed analysis.

In sum, each of the prior art solutions are lacking in user flexibility, have a high chance of error propagation due to user error, or will result in the need for a higher pin count from dedicated diagnostic pins. Hence, there is a need for a system and method which avoids the shortcomings of the prior art solutions and offers the opportunity for the accurate collection of data from subject chips.

SUMMARY OF THE INVENTION

These and other objects, features and technical advantages are achieved by a system and method which uses shared pins to drive external configuration data onto the chip and then, if the configuration is through software control or some other internal control method inside the chip, to drive the data back out onto the same line so that there need only be a single monitor point. In doing so, a single point can be monitored so that it is possible to know at all times what data are seen by a subject chip. This is accomplished through a drive hierarchy which dictates which control method will prevail such that, if multiple control methods are employed (or if a monitor attempts simultaneous usage of multiple control methods), one method will prevail over the others under the inventive hierarchy. Accordingly, the drive hierarchy is a planned scheme which is set so that regardless of which method is actually used, the data will be properly reflected on the lines through a ratio of impedance and pull resistance.

One embodiment involves the use of simultaneous control schemes, both internal and external, to set the external control through a three position switch, where the control lines could be driven high, low, or left floating, (i.e., driven neutral). In this case, if the monitor recognized that it would be better to use internal control, the monitor would set the switch to the middle position, where the line was not driven either way. This would allow the chip to drive the information therefrom on the same lines as it was driven in, so that the relevant data could be logged as being the configuration being used by the chip. This has a slight advantage, in that it allows the monitor to log the information with regards to configuration. Yet another embodiment might involve dedicating extra pins on the chip for driving out configuration information only. One possible solution therein is the use of two sets of pins, one set for driving in configuration information and another for driving out the actual status information. The output from the actual status information will be considered to be the final value. However, this embodiment requires additional pins and both of the above embodiments can yield different data, regardless of the particular control employed thereon.

Thus, in an especially preferred embodiment, the inventive system provides for a logic analyzer or other processor to receive data from a single port on the chip (or ASIC) which is being tested. The inventive system further permits the monitor to receive the information from a port which includes both data being transferred out of the chip in the debugging processes, and information relating to the configuration of the debugging process (e.g., an indication as to which needed from within the chip are the sources of the given information). The resulting descriptive information may arrive from hardware configuration on a subject chip, or may be the result of a software override of that hardware. Under either embodiment, the inventive solution provides that the receiving processor receives accurate data, based on a proprietary hierarchy which has been implemented prior to the logic analyzer receiving it.

An important advantage of the inventive system described herein is that it provides an error free reading of the internal state of the chip through a single monitor point, thereby eliminating uncertainty in analysis and avoiding the need for additional pins. Also, the inventive system further provides for the advantage of avoiding the possibility of electrical damage (which might occur where, say, a user tries to pull too much current from the driver). Moreover, the present invention provides the advantage of allowing the usage of both internal and external methods of control. Provision of such allows the user to adjust for prevailing diagnostic preferences, while offering the easiest methodology by which to run the diagnostics. Accordingly, the inventive system is user friendly yet flexible. Moreover, the reduction of user error and the potential impact of user error in the present invention offers a more time efficient testing schedule for a monitor. Also, the present invention yields the possibility of providing more functionality, both on chip and off chip, in terms of monitor control of diagnostic functionality.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Figure 1:
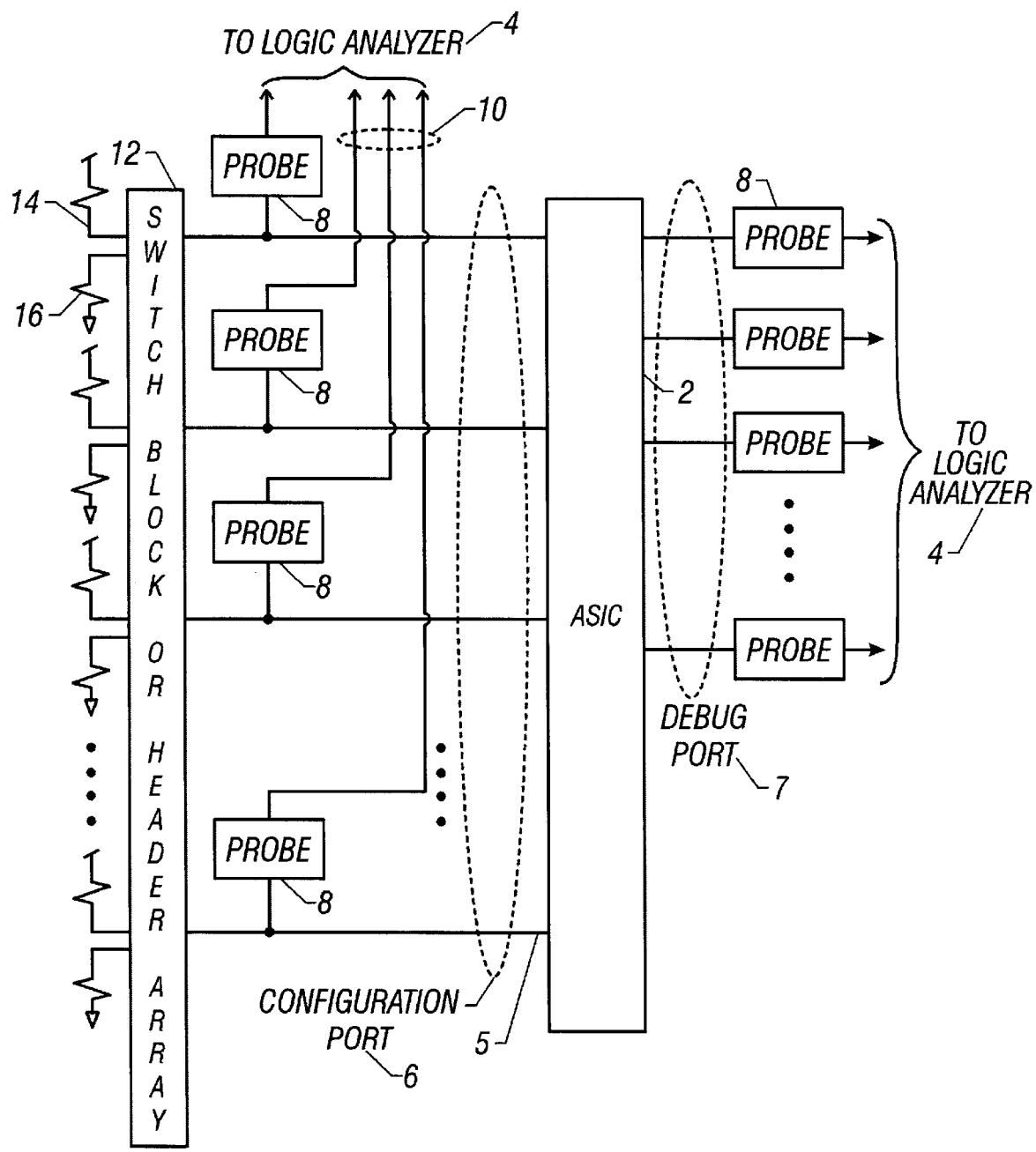
FIG. 1 is a high level block diagram of an exemplary ASIC with an embodiment of the inventive probe, control lines and switch block.

FIG. 1 depicts a high level view of an exemplary implementation of the inventive system, which may comprise an IC (such as ASIC 2), coupled with a plurality of lines or wires 10, each with a dedicated connection to ASIC 2 for the purposes of driving in external control information, as well as for driving out configuration information through at least one control line 5 to a port such as configuration port 6. Although variants related to the complexity of a given implementation of the inventive system could involve one or more lines 5, a preferred embodiment would utilize a number of lines, which might range from approximately 4 to 25 of such lines. Ideally, each of lines 5 will be situated on a printed circuit board 54 (see FIG. 4), and connected to switch block 12. The inventive system preferably provides for switch block 12 having a structure such as a jumper block, or header array. In an especially preferred embodiment, switch block 12 will be a 100 mm header block with jumpers. As such, switch block 12 can be used to drive either a logical 1 or logical 0 value at 58 (see FIG. 4), thereby effectively tying lines 5 through a resistance to a power supply (not pictured), to the ground or to the reference plane in order to drive data into the chip. Lines 5 are each matched to at least one probe circuit 8, which can tap off data and feed it to a controller or monitor, or in a most preferred embodiment, supply data to a logic analyzer 4.

Figure 2A:
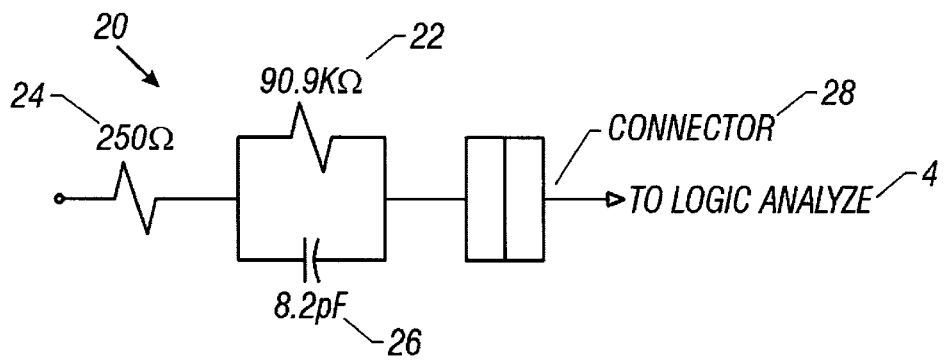
FIGS. 2A and 2B are circuit diagrams of an exemplary theoretical probe tip and of an exemplary actual probe tip.
Figure 2B:
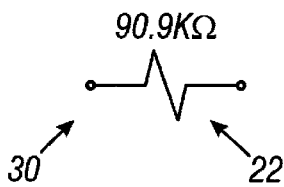

The specifics of a given probe circuit 8 are generally determined by what type of controller or monitor is used in the particular monitoring operation at hand. This structure may vary from a high resistance provided by an active probe, or even as provided by a PC board trace. In the preferred embodiment, the particular form will therefore be specifically governed by the specifications given by the manufacturer of the logic analyzer, such as seen in the exemplary embodiments of FIGS. 2A and 2B. FIGS. 2A and 2B illustrate details regarding the implementation of probe circuit 8, there are two basic exemplary circuits shown, the first of which is shown as 20 in FIG. 2A as comprising a combination of a 250 ohm resister at 24, a 90.9 kilo ohm resister at 22, and an 8.2 picofarad capacitor at 26. This specific probe circuit is structured according to the specification of Agilent Technologies of Palo Alto, Calif. (USA), incorporated by reference, for use with their proprietary logic analyzer. This is only one potential implementation of probe circuit 8, so circuit 20 is hereafter referred to as theoretical, as it represents only one particular embodiment of a probe circuit which may be used with the invention. Hence, all of FIGS. 1–4 may be adjusted or reconfigured, depending on which type of processing device data is received. Accordingly, circuit 30, FIG. 2A depicts only 90.9 kilo ohm resistor 22 because, strictly speaking, the other two components shown in the theoretical probe tip circuit are not necessary, given that any probe tip applicable to the monitoring device used could be used in this specific instance. Thus, this depiction is based on the actual electrical nature of the signals which result from a primarily steady state.

Figure 3:
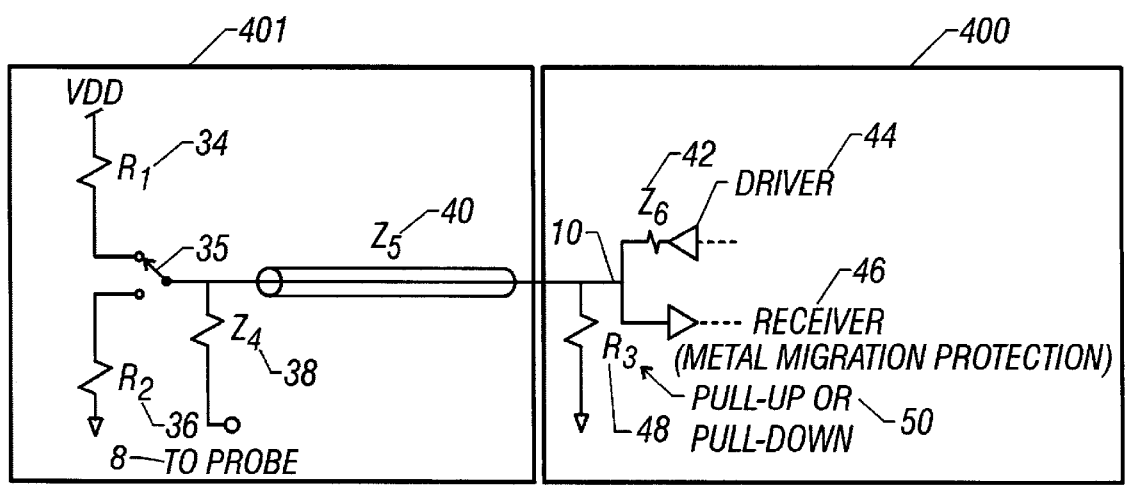
FIG. 3 is a circuit diagram reflecting an exemplary physical situation reflecting the inventive resistance/impedance relationship.

FIG. 3 depicts the primary components of the inventive circuitry. As seen at $R_1$, a weak pull up resistor 34 is present on the printed circuit board; at $R_2$ is a weak pull down resistor 36 on printed circuit board 54, and $R_3$ is a resistor which, is most preferably a part of the driver circuitry on the chip that is used for protection purposes. A driver 44 is provided on ASIC 2 (FIG. 4) at $Z_6$, which may generally comprise a specific resistor as generally known in the art, and needs typically integral with driver 44 topology on ASIC 2. $Z_4$ and $Z_5$, while not necessarily critical to the present disclosure, relate to the characteristic impedance of printed circuit board 54 and are included as part of the preferred embodiment. Specifically, $Z_5$ is the characteristic impendence of the trace (i.e., wire(s), not depicted) on the printed circuit board, while $Z_4$ is listed as the impedance of the probe tip, or probe circuit in general.

FIG. 3 depicts a structured backdrop representative of the inventive system hierarchy which ensures that the correct data is always viewable on a given configuration port at 6 (FIG. 1). Preferably, the inventive hierarchy is accomplished through a ratio of resistances. With specific regard to pull up and pull down resistors 50 (which are part of switch block header array 12 (FIG. 1)), there is a ratio of those particular resistances with the impedance of driver 44 (located inside the ASIC 2 (FIG. 4), indicated by value 26 (FIG. 2A)) of $Z_6<R_1/5$ and $Z_6<R_2/5$. There are two ratios with regards to resistor (48) at $R_3$ (which represents a typical resistor on the I/O circuit of a chip) and pull up resistor (34) $R_1$ and pull down resistor (36) $R_3$. The relationship with regard to pull up resistor (34) at $R_1$ will typically be $R_1<R_3/5$, and with regard to pull down resistor (36) at $R_2$ will typically be $R_2<R_3/5$. Typically pull up resistor (34) at $R_1$=pull down resistor (36) at $R_2$. The resistance depicted therein is needed to protect an I/O circuit from metal migration caused by a pin being at an intermediate voltage level which is between ground at 36 and VDD at 32. This resistance setting ensures that a consistent level (either high or low) is driven into receiver 46, regardless of whether a given pin (not pictured) is specifically driven by an external source or not. Resistor $R_3$ (48) is labeled within pull up or pull down resistor 50 because $R_3$ (48) may, in addition, to pulling to ground as depicted, can alternatively pull up to VDD at 32. Thus, a driver circuit needs to be compatible with the inventive configuration in FIG. 3. In order to provide this comparability, a hierarchy is structured so that internal configuration would always override any configuration driven externally. To accomplish this, the system imposes a requirement that the driver impedance, represented at $Z_6$, is much less than either the pull up or pull down resistance represented by $R_1$ (34) or $R_2$ (36). Specifically, the preferred inventive formula generally requires that $Z_6$ should be less than ⅕ of either the pull up or pull down resistance. This ratio is preferred as it ensures that the chip driver can always overdrive any information driven by the pull up or pull down resistances on the printed circuit board and avoid the possibility of electrical damage resulting from system disturbance therefrom. Similarly, the external pull up or pull down resistors should be configured to overdrive the protection circuit that is inherent in the driver receiver circuit on the chip, the resistance of which is represented at $R_3$. Using a preferred ratio, both $R_1$ and $R_2$ generally need to be less than ⅕ of $R_3$.

In order to avoid disturbing the system during a test, the probe tip impedance at $Z_4$ should be much greater than that of the board trace impedance at $Z_5$. A preferred ratio is about 10:1. Although this ratio may not remain constant, the 10:1 ratio is generally preferred because it provides a wide margin with which to avoid any untoward disturbance in the system under test.

Thus, resistance values are determined in the preferred embodiment based on the value seen on the printed circuit board 54 trace (and therefore the probe) so as to be consistent with the configuration actually used internal to the chip. If the internal configuration information takes precedence, then the subject data will be driven out of the chip with a lower impedance than the external resistances. If however, the converse should be the case, and the external information takes priority for determination of a configuration, the ratio of resistances would be such that the external resistance will be much lower than the impedance $Z_6$ of driver 44, and will therefore set the value seen by probe circuit 8.

Figure 6:
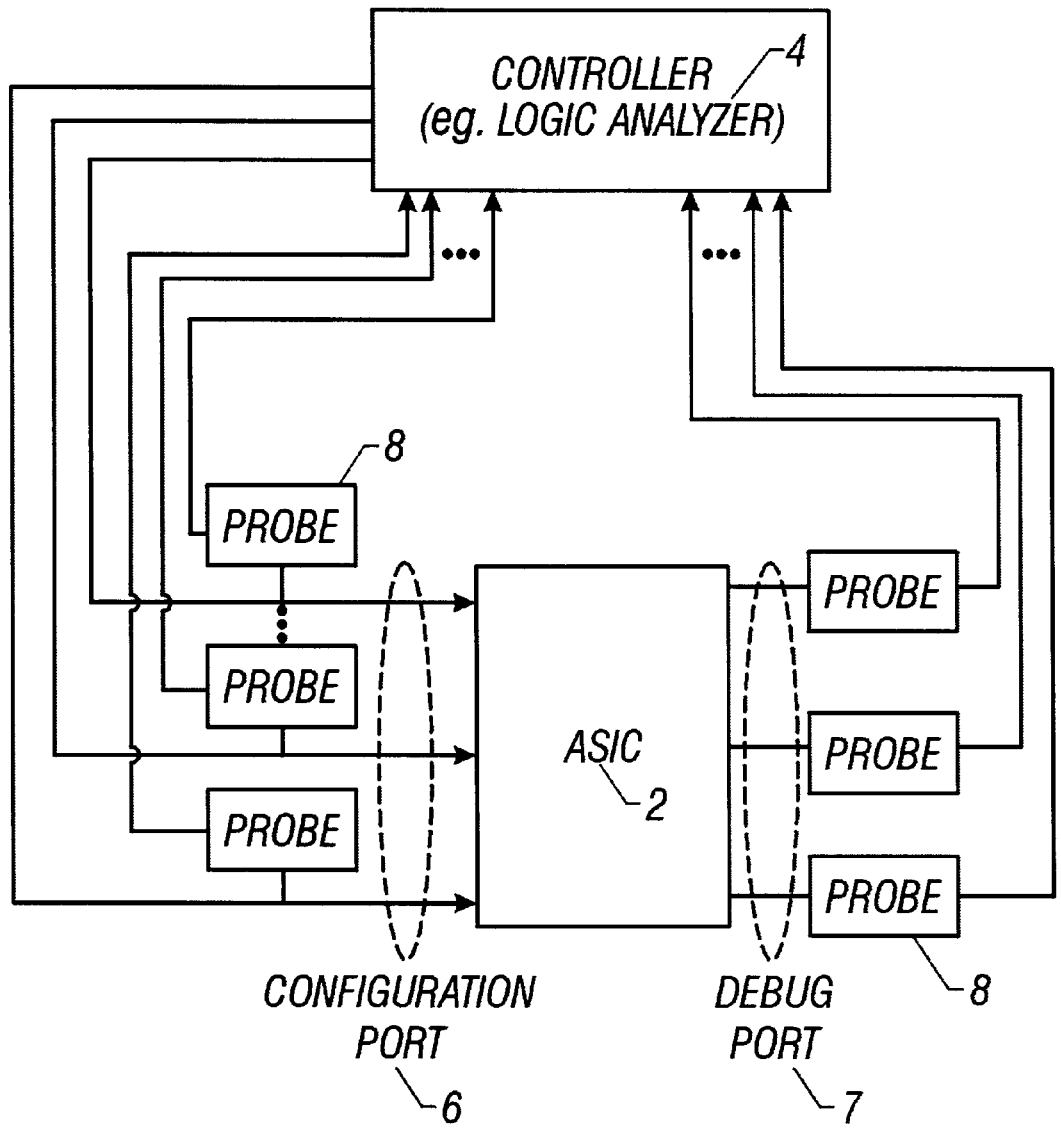
FIG. 6 is a high level block diagram of an exemplary ASIC with an embodiment of the inventive system, including the preferred configuration of debug ports and configuration ports.

Essentially, whatever data is being used will be the only data which is available for reading. By way of additional example, a given line on a system might have externally settings set to drive too high. Because the system provides for software 52 to configure the chip to have a low value, the chip can then drive a low value so that it may overdrive whatever control is being driven externally (i.e., external control such as systems softwares, as known in the art). This yields binary information off of the connected lines 10, which maps to a certain source for data being driven on debug port (see FIG. 6). In this specific example, there might be, e.g., 25 of lines 10, the collective grouping of which amounts to approximately 33, 554, 432 combinations of bits (i.e., $2^{25}$), meaning the different configurations that exist from those 25 of lines 10. The inventive system then provides for a table where, if the configuration reveals a certain value, then the value will relate to a location from where the data is viewed. Conversely, if it is desired to view data from portions of ASIC 2, then the 25 of lines 10 will need to be set accordingly.

With continuing reference to FIG. 3 (and with cross reference to FIG. 4) driver 44 and receiver 46 are preferably located inside ASIC 2. Driver 44 when referred to in terms of label $Z_6$, is representative of driver 44 driving data out of ASIC 2, while together with receiver 46 are reflective of a particular pin (not shown) which is not just a driver or a receiver, but is capable of acting as both driver and receiver.

Figure 5:
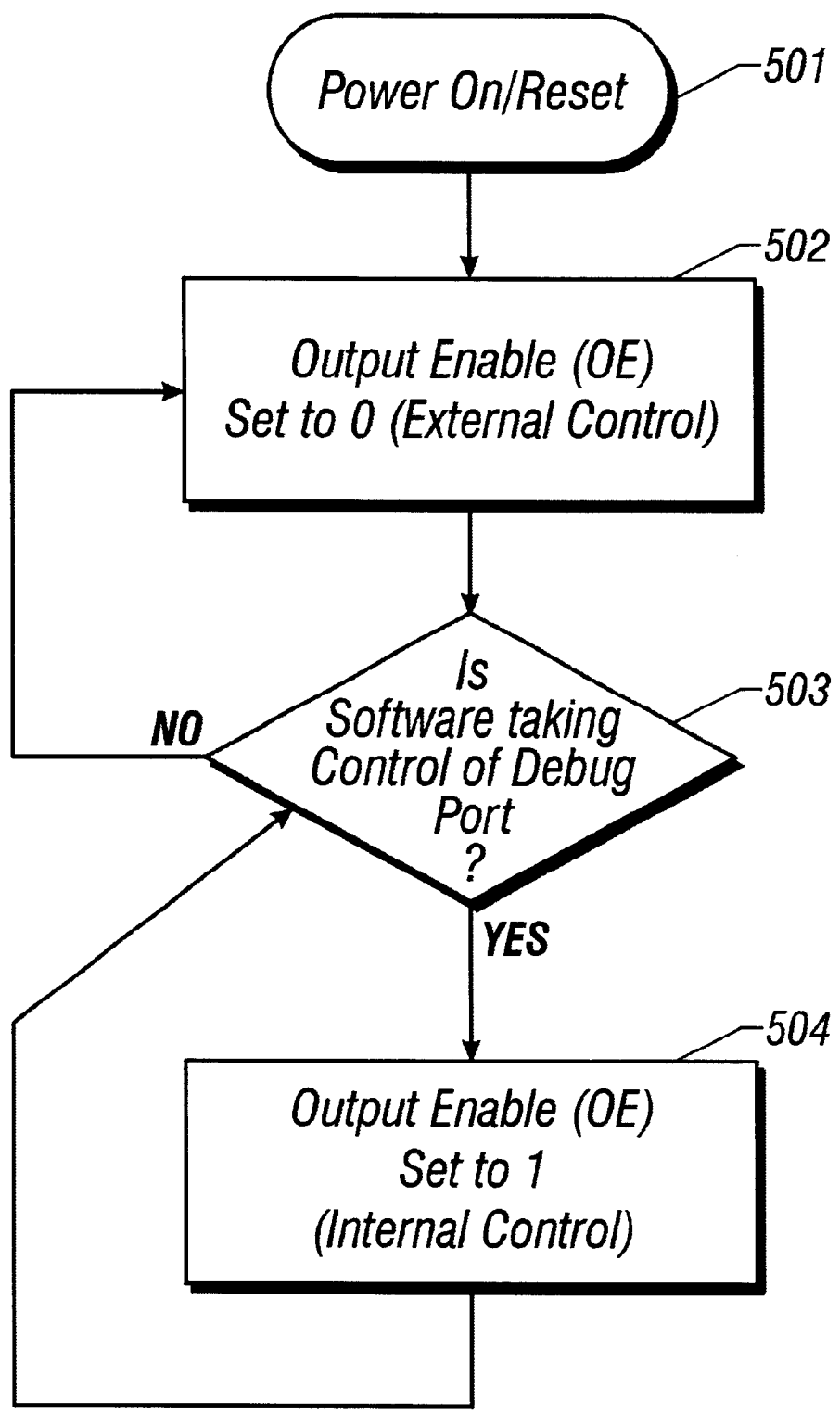
FIG. 5 is a flow diagram of the general steps involved in the inventive internal software control.

The value of probe circuit 8, located typically attached to PCB 54 might represent, in a preferred embodiment, a logical 0 where switch 35 is attached to $R_2$ and then through $R_2$ to ground (thereby yielding the logical 0). This logical pathway embodiment represents one way in which to set the line $Z_5$ (40) to 0, thereby ensuring that the value read by $Z_4$ (38) is a logical 0. With respect to the setting of switch 35 to $R_1$ (34) or $R_2$ (36) to correspond to an external hardware setting, the inventive system provides that this setting can be overridden by software where needed, or where it is more convenient to do so. Thus, the software always overrides the hardware when configured with a default setting and where say, a chip is connected via lines to a DIP and the DIP is set to a low value, but the chip is set to a high value, the chip value will prevail because it has been configured to prevail over switch block 12, regardless of whether the value is high or low. Similarly, if the DIP is driving high, and the chip is driving low, then the chip value, because it has a lower impedance, will prevail. Accordingly, the inventive software will automatically avoid any two potential conflicting values and if there are two such values, it sets a win by default setting (which will be set to be either the chip or header block, but will consistently be the same one setting), thereby avoiding the transmission to the monitor of conflicting data. When configured as such, the flow chart, showing steps 501–504 depicted in FIG. 5, avoids the common problem existing in the prior art where two control or test methods would lead to conflicting or duplicative data.

By way of specific example of the internal operations of the software or other control basis override, if switch 35 is set at $R_2$, then the line shows a logical 0. If the driver is driving information such as a logical 0, then there is no change. If, however, the driver tries to drive a logical 1, with VDD 32, (i.e., a power rail), then the lower impedance of driver 44 allows it to force a stronger pull on line 10 than the resistance at $R_2$ (36) does. Effectively, the whole circuit becomes a resistor divider where there is a smaller resistance between $Z_5$ and VDD 32, or power rail for a logical 1, when compared to the larger resistance of $R_2$ that is trying to pull line 10 down to ground. That lower resistance means that a given line 10 will have a higher value, rather than a lower value, (i.e., a logical 1 instead of logical 0). Thus, $Z_6$ is less than $R_2/5$, and the value therein gets pulled up to 5/6 of the value of VDD 32 or power rail, (i.e., using a resistor divider of equation of $R_A \bullet (VDD)/RA+R_B$, which using the named elements of the inventive circuitry is $R_2/Z_6+R_2 \bullet (VDD)$, which is enough to establish a logical 1). By way of contrast, if both locations were both driving a logical 0, there would be a complete ground, as opposed to a value of 5/6 of ground.

Figure 4:
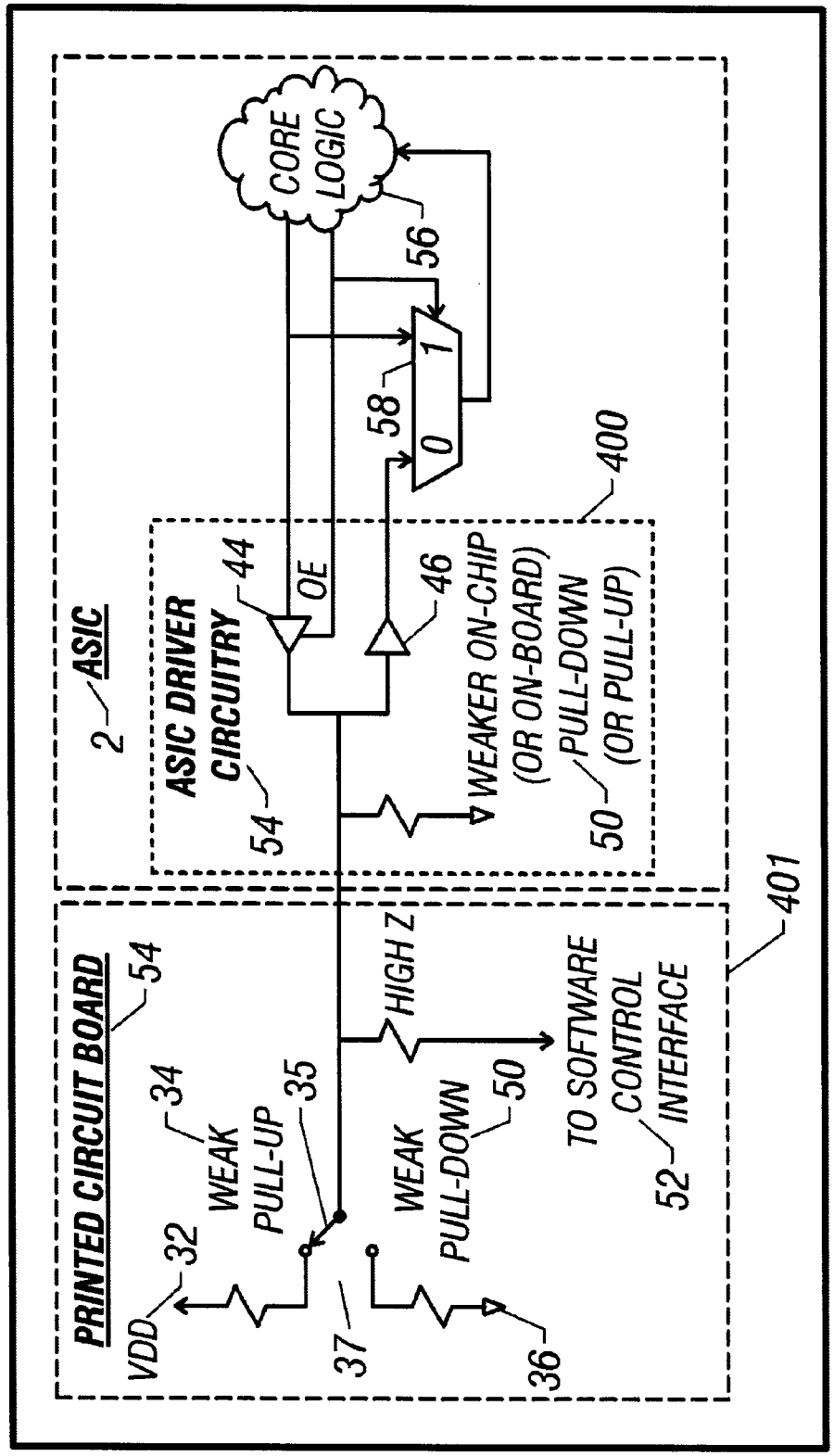
FIG. 4 is a system overview incorporating the inventive circuitry which shows each of the relevant components in relation to each other.

FIG. 4 thus depicts a high level view of the inventive design. Core logic 56 is internal logic of ASIC 2. ASIC driver circuitry 54 comprises receiver 46, driver 44, which is in an Output Enable "OE" state which means that driver 44 is configured to be inactive (high impedance) unless an output enable line is "turned on". This physical configuration generally requires specific control to avoid unintentionally driving data, and is preferably implemented inside ASIC 2. More specifically, ASIC 2 needs, in a preferred embodiment, to be initialized to receive configuration information, driven externally onto ASIC 2, such that when ASIC 2 is turned on, ASIC driver circuitry 54 expects to receive data and once received, will drive that data through the multiplexor 57 to core logic 56 of ASIC 2. Essentially, new configuration data is driven out onto lines 10 (which may comprise at least one of the group of wires/lines/traces) lines on printed circuit board (PCB) 54, preferably between the ASIC 2 and weak pull up and weak pull down resistors 50. In another embodiment, lines 10 may be positioned between two sets of ASIC 2, rather than between a single ASIC 2 and pull up and pull down resistor 50, so as to yield the benefit of moving control of the debug port in FIG. 6. Although the data need not be driven through multiplexor 58, multiplexor 58 is provided in a most preferred embodiment as it offers an easier way to switch control external and internal. If internal control methods are used to establish what data is driven on a debug port (i.e., configuration port 6), then core logic 56 can switch multiplexor 58 so as to receive its own data back again. Core logic 56 can then process the data through the same line of lines 10 (located originally in ASIC 2), so as to enable the output of driver 44 when driver 44 drives the new data out to printed circuit board 54 so that it may be observed by a monitor (e.g., via a connected logic analyzer 4). Further provided is software interface 58, which might comprise any standard logic analyzer known in the art, but in a most preferred embodiment will be a logic analyzer such as model number 16557D logic analyzer card available from Agilent Technologies, Inc., Palo Alto, Calif. (USA).

In an especially preferred embodiment, it is advantageous to add a delay to the output lines in order to match in time the data arrived with the configuration information arrival. The delay is accomplished through the use of pipeline stages. The actual configuration information, or any change thereon, is driven out on to printed circuit board 54, simultaneously with any data matching, to the debug port (i.e., configuration port 6). This particular driving, however, does not occur by default, so the inventive system generally needs to ensure that it occurs by adding extra delay stages between core logic 56 and driver 44. These stages may be provided for by flip flop circuits or latches as known in the art.

In a preferred embodiment of the present invention, there are two dedicated ports where the configuration information is made available. One port is for the control information or configuration information (configuration port 6), regardless of whether that configuration is driven externally or internally. The other dedicated port is for the actual data on reflecting the value of various source nodes (e.g., buses or registers, not pictured) and are driven out from inside the chip at a high bit rate or high frequency (debug port, not pictured). This contrasts with the relatively steady state nature of the configuration information. As long as the data continues to originate from the same place, the configuration or control port does not change; however, if the origination point should change, the inventive system provides for a monitor to revise the point of origin of the data while fluidly monitoring it. This is accomplished through unilateral modification of the configuration information via the receiving logic analyzer. One way in which this unilateral change may be made is through the process of driving data along the same port which receives configuration information (see generally FIG. 6). This illustrates a difference between a control interface compared to a mere configuration, given that a monitor can intelligently control the origin of the data based on the data actually viewed. Accordingly, if there is a value which comes out of a Source A (not depicted), then the monitor can immediately switch and monitor a Source B (not depicted). As such, there are generally three entities then that can establish the configuration:

logic analyzer 4; core logic 56 of ASIC 2; and hardware jumpers (not shown) of switch block 12. Viewed in terms of external versus internal, instead of utilizing hardware jumpers, a monitor could choose to connect the subject lines directly into a logic analyzer or other computer interface. Once provided with the ability to manipulate those lines intelligently, a monitor would not need to utilize hardware jumpers because replaced by the controller itself (e.g., logic analyzer 4).

Thus, the actual configuration information can be driven at the same time as the data itself. A user need not rely on recording the configuration while capturing the data and then modifying that configuration. This is because the system provides the monitor with the ability to change the configuration spontaneously. This represents a clear advance over previous methods, given that the previous methodologies did not allow for such dynamic configuration modifications.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of utilizing a single point to monitor debugging data of a subject chip in order to prepare a diagnostic test, said method comprising the steps of:

establishing a hierarchy which dictates prevailing control methods; and employing said prevailing control method to obtain debugging data from said subject chip via said single point in order to prepare a diagnostic test.

2. The method of claim 1 further comprising the step of:

utilizing at least one of:

(i) an external control, or (ii) an internal control, when employing said control method to obtain said debugging data from said subject chip.

3. The method of claim 1 wherein said establishing step includes the step of:

implementing a ratio of impedance to resistance.

4. The method of claim 3 wherein said last-mentioned step further comprises the step of:

configuring said ratio to provide for said debugging data to be provided at least in part from a hardware configuration.

5. The method of claim 4 wherein said last-mentioned step further indicates the step of:

said debugging data, at least in part, from a software override of said hardware configuration.

6. A module for utilizing a single point to monitor debugging data of a subject chip, said module comprising:

a hierarchy module for establishing a hierarchy which dictates one prevailing control apparatus;

a control module for employing said prevailing control apparatus to obtain debugging data from a said subject chip in order to prepared a diagnostic test; and a reception module for receiving said debugging data from said subject chip via said single point.

7. The module of claim 6 further comprising:

a utilization module for utilizing at least one of:

(i) an external control module, or (ii) an internal control module when employing said control apparatus to obtain said debugging data from said subject chip.

8. The module of claim 6 further comprising:

an implementation module for establishing said hierarchy which dictates one prevailing control apparatus by implementing a ratio of impedance to resistance.

9. The module of claim 8 wherein said implementation module further includes a hardware configuration module configuring said ratio to provide for said debugging data to be provided at least in part from a hardware configuration.

10. The module of claim 9 when said hardware configuration module further includes a software override module for said debugging data to be provided at least in part from a are software override of said hardware configuration.

11. A method of providing a chip according to diagnostic testing which utilizes a single pin to monitor debugging data of a subject chip, said method comprising the steps of:

establishing a hierarchy which dictates a prevailing control method; and employing said prevailing control method to obtain debugging data from a said subject chip via said single point in order to prepared a diagnostic test.

12. The method of claim 11 further comprising the step of:

utilizing at least one of:

(i) an external control method, or (ii) an internal control method, when employing said control method to obtain said debugging data from said subject chip.

13. The method of claim 11 wherein said establishing step includes implementing a ratio of impedance to resistance.

14. The method of claim 13 further comprises the step of configuring said ratio to provide for said debugging data to be provided at least in part from a hardware configuration.

15. A test system for debugging data of a subject chip, said system comprising:

means for establishing a hierarchy in which one of a plurality of test methods will be used at a given point in time; and means for employing a prevailing one of said test method to obtain debugging data from said subject chip via a single point on said chip in order to prepared a diagnostic test.

16. The system of claim 15 wherein said establishing means includes a ratio of impedance to resistance.

17. The system of claim 16 wherein said establishing means further includes means for configuring said ratio to provide for said debugging data to be provided at least in part from a hardware configuration.

18. The system of claim 17 wherein said configuring means further includes means for selecting said test method, at least in part, from a software override of said hardware configuration.

19. The system of claim 15 wherein said establishing means include:

means for enabling a selected one of said test methods.

* * * * *

UNITED STATES PATENT AND TRADEMARK OFFICE
CERTIFICATE OF CORRECTION

PATENT NO. : 6,587,965 B1  Page 1 of 1
APPLICATION NO. : 09/563004
DATED : July 1, 2003
INVENTOR(S) : Ian P. Shaeffer et al.

It is certified that error appears in the above-identified patent and that said Letters Patent is hereby corrected as shown below:

Claim 6, Column 9, line 36, delete "prepared" and insert therefor --prepare--

Claim 10, Column 10, line 6, after "a" delete "are"

Claim 11, Column 10, line 15, delete "prepared" and insert therefor --prepare--

Claim 15, Column 10, line 35, delete "prepared" and insert therefor --prepare--

Signed and Sealed this

Sixth Day of October, 2009

David J. Kappos
*Director of the United States Patent and Trademark Office*